United States Patent [19]

Nakagaqa et al.

[11] 4,403,043
[45] Sep. 6, 1983

[54] GLASS FOR PHOTOETCHING MASK

[75] Inventors: Kenji Nakagaqa, Tokorozawa; Isao Masuda, Tokyo, both of Japan

[73] Assignee: Hoya Corporation, Tokyo, Japan

[21] Appl. No.: 413,316

[22] Filed: Aug. 31, 1982

[30] Foreign Application Priority Data

Aug. 31, 1981 [JP] Japan ................................ 56-135594

[51] Int. Cl.$^3$ ............................ C03C 3/04; C03C 3/10
[52] U.S. Cl. ........................................ 501/70; 501/62
[58] Field of Search ............................ 501/62, 70, 26; 156/654

[56] References Cited

U.S. PATENT DOCUMENTS

| | | | |
|---|---|---|---|
| 3,069,294 | 12/1962 | Davis | 501/62 |
| 3,847,627 | 11/1974 | Erickson et al. | 501/70 |
| 4,102,692 | 7/1978 | Schartam et al. | 501/70 |
| 4,297,141 | 10/1981 | Tokanaga et al. | 501/70 |

*Primary Examiner*—Mark Bell
*Attorney, Agent, or Firm*—Sughrue, Mion, Zinn, Macpeak & Seas

[57] ABSTRACT

A glass composition for a photoetching mask is described, which comprises, all by mol, 55 to 70% $SiO_2$, 7 to 11% $Al_2O_3$, 7 to 20% CaO, 3 to 13% MgO, 3 to 13% ZnO, 0.5 to 3% $K_2O$ or $Na_2O$, 0 to 11% PbO and 0 to 3% $ZrO_2$. This glass is free from defects such as pinholes, has a relatively low coefficient of thermal expansion and contains no air bubbles, and a photoetching mask composed of the glass composition.

2 Claims, No Drawings

GLASS FOR PHOTOETCHING MASK

FIELD OF THE INVENTION

The present invention relates to glass compositions for photoetching masks which are used in the preparation of integrated circuits.

BACKGROUND OF THE INVENTION

In producing integrated circuits by photoetching, a glass mask on which a pattern corresponding to an integrated circuit has been formed using a metal, such as chromium, is placed on a photoresist layer coated on a silicon substrate, and is then exposed to light to form a latent image of the pattern on the photoresist layer. After the exposure, processings such as development and etching are generally conducted to obtain the desired integrated circuit.

Such glass masks for use in photoetching must have a small coefficient of thermal expansion and be free of air bubbles or striaes. Further, such glass masks must meet the following requirements:

(1) They permit sharp patterns to be formed thereon which do not have defects such as pinholes in a chromium film.

(2) They have high adhesion to the chromium film and are resistant to a heat treatments or supersonic wave cleaning.

(3) They are resistant to strong acids and/or alkalis which are used in, for example, washing treatments and peeling apart photoresist layers.

Conventional glass compositions for photoetching masks include $SiO_2$—$B_2O_3$-alkali metal oxide and $SiO_2$—$Al_2O_3$—alkaline earth metal oxide compositions.

The $SiO_2$—$B_2O_3$-alkali metal oxide compositions are relatively stable glass compositions. However, since a large amount of boric acid is used as a starting material, striaes tend to be formed due to volatilization during melting of the glass compositions and this makes it difficult to obtain a homogeneous glass.

On the other hand, the $SiO_2$—$Al_2O_3$-alkaline earth metal oxide compositions have the advantage that the glasses obtained therefrom have a small coefficient of thermal expansion, but have the defect that the glasses are unstable and tend to devitrify and also the viscosity of the glass compositions during melting is high.

SUMMARY OF THE INVENTION

As a result of extensive studies on $SiO_2$—$Al_2O_3$—RO glass compositions to develop such glass compositions for photoetching masks having a small coefficient of thermal expansion, being free of air bubbles or striaes, meeting requirements (1) to (3) as described hereinbefore and having a low viscosity and good melt properties during melting, it has been found that the use of CaO, MgO and ZnO in appropriate proportions as the RO component and the incorporation of a suitable amount of $Na_2O$ or $K_2O$ provide the desired glass composition for photoetching masks.

The present invention, therefore, provides a glass composition for a photoetching mask, consisting essentially of, all by mol%, 55 to 70% $SiO_2$, 7 to 13% $Al_2O_3$, 7 to 20% CaO, 3 to 13% MgO, 3 to 13% ZnO, 0.5 to 3% $K_2O$ or $Na_2O$, 0 to 11% PbO and 0 to 3% $ZrO_2$.

DETAILED DESCRIPTION OF THE INVENTION

In the glass compositions of the invention, the $SiO_2$ content is within the range of from 55 mol% to 70 mol%. When the $SiO_2$ content is more than 70 mol%, the durability of the glass is improved and the coefficient of thermal expansion is decreased but the melt properties of the glass are deteriorated and the viscosity is increased, whereas when it is less than 55 mol% the coefficient of thermal expansion is increased and only an unstable glass having poor durability is obtained.

$Al_2O_3$ greatly affects the stability and durability of the glass. For stabilization of the glass, in general, it is most preferred to control the $Al_2O_3$ content to about 9 mol% regardless the amount of $SiO_2$ and the RO component. However, in the glass compositions of the invention in which the alkali metal oxides are present, 7 to 13 mol% of $Al_2O_3$ are useful to impart the stability and durability to the glass.

In the glass composition of the invention, the three elements of CaO, MgO and ZnO are used in combination as the RO component. Each of those elements contributes to increase the stability of the glass. Of those elements, MgO is particularly effective in lowering the coefficient of thermal expansion and ZnO is particularly effective in lowering the viscosity. It is preferred to adjust the ratio of CaO to MgO to ZnO to 1/1/1.

The glass compositions of the invention contain $Na_2O$ or $K_2O$ as alkali metal oxides in an amount of 0.5 to 3 mol%. The alkali metal oxides are useful to lower the devitrification temperature of the glass and lower the viscosity during melting. When $Li_2O$ is used or $Na_2O$ or $K_2O$ is used in an amount exceeding 3 mol%, the chemical durability of the glass is deteriorated, the adhesion strength between the glass and chromium film deposited on the surface thereof is decreased and so-called mouth nips (pinholes) tend to cause on the chromium film. However, where $Na_2O$ or $K_2O$ is contained as the alkali metal oxide in an amount of 0.5 to 3 mol%, mouth nips do not cause so long as heat treatment is conducted at a temperature of about 200° C.

In addition, in the glass compositions of the invention, $Na_2O$ and $K_2O$ should not be co-used and $Na_2O$ or $K_2O$ should be used individually. If $Na_2O$ and $K_2O$ are co-used, the size of the glass varies with the passage of time to an extent such that the variation cannot be disregarded.

The glass compositions of the invention can contain 0 to 11 mol% of PbO and 0 to 3 mol% of $ZrO_2$ as optional components.

PbO has the effects of stabilizing the glass and lowering the viscosity of the glass and also has a superior effect in improving the durability as compared with other RO components. However, since addition of a large amount of PbO results in strong absorption of ultraviolet light, the maximum amount of PbO added is 11 mol%.

$ZrO_2$ has the effects of improving the durability though slightly increasing the viscosity and of lowering the coefficient of thermal expansion. Use of a large amount of $ZrO_2$ makes to glass unstable. Therefore, $ZrO_2$ is used in an amount of 0 to 3 mol%.

TABLE 1

| No. | SiO$_2$ | Al$_2$O$_3$ | CaO | MgO | ZnO | PbO | Na$_2$O | K$_2$O | ZrO$_2$ |
|---|---|---|---|---|---|---|---|---|---|
| 1 | 61.0 | 9.0 | 9.5 | 9.5 | 6.5 | 3.0 | 1.5 | — | — |
| 2 | 62.5 | 9.0 | 9.3 | 9.3 | 6.3 | 1.6 | 2.0 | — | — |
| 3 | 59.0 | 9.0 | 7.3 | 7.3 | 7.2 | 7.2 | — | 3.0 | — |
| 4 | 59.0 | 9.0 | 7.3 | 7.3 | 7.2 | 7.2 | 3.0 | — | — |
| 5 | 65.0 | 9.0 | 9.5 | 7.0 | 7.0 | — | — | 2.5 | — |
| 6 | 64.0 | 7.0 | 9.5 | 7.0 | 7.0 | — | 1.5 | — | 2.5 |
| 7 | 55.0 | 13.0 | 7.3 | 7.3 | 7.2 | 7.2 | 3.0 | — | — |
| 8 | 69.0 | 7.0 | 5.3 | 5.3 | 5.2 | 5.2 | 3.0 | — | — |

Glasses having the formulations shown in Table 1 above were prepared by melting the corresponding feedstock at 1,400° to 1,500° C. and then cooling at a rate of 10° C. per hour. The characteristics of the glasses thus-prepared were evaluated, and the results are shown in Table 2.

The coefficient of thermal expansion was determined within the temperature range of from 50° C. to 200° C., and the glass transition temperature was determined by a flex point in a thermal expansion curve. The liquid layer temperature, which is a measure of stability, was determined by placing a piece of glass on a platinum plate, holding it for 3 hours in an oven which was heated at a constant temperature-raising rate, and by measuring the upper limit of the temperature at which devitrification of the glass occurred. In the scorching test with a strong acid solution for washing, the glass was soaked for 30 minutes in a dichromic acid mixed solution (prepared by adding 70 g of potassium dichromate to 2 liters of concentrated sulfuric acid) maintained at 90° C. and the formation of any abnormality on the surface of the glass was observed. In the mouth nip test of chromium film, a 2.5 square inch glass plate was washed, subjected to chromium coating and patterning, and then, heat treated at 200° C. for 30 minutes, whereafter, the formation of mouth nip (pinholes) was examined.

As can be seen from the results shown in Table 2 above, the glass of the invention has a coefficient of thermal expansion as low as $40 \times 10^{-7}$ to $60 \times 10^{-7}$/°C., and a Knoop hardness of at least about 600 kg/mm$^2$.

The glass of the invention also has good durability against strong acids used in washing and resist removal steps, the adhesive strength to a metal deposited film such as chromium is good and defects such as pinholes are not caused.

Furthermore, since the glass compositions of the invention contain alkali metal oxide, PbO and ZnO, the viscosity is about 200 poises at 1350° C. and is relatively low and melting properties are good. This means that the glass having substantially no air bubbles can be produced at low temperatures.

According to the invention, therefore, a masking glass can be produced at low production costs.

While the invention has been described in detail and with reference to specific embodiment thereof, it will be apparent to one skilled in the art that various changes and modifications can be made therein without departing from the spirit and scope thereof.

What is claimed is:

1. A glass for a photoetching mask, consisting essentially of, 55 to 70% SiO$_2$, 7 to 13% Al$_2$O$_3$, 7 to 20% CaO, 3 to 13% MgO, 3 to 13% ZnO, 0.5 to 3% K$_2$O or Na$_2$O, 0 to 11% PbO and 0 to 3% ZrO, wherein all percents are molar.

2. A photoetching mask, consisting essentially of a glass which consists essentially of 55 to 70% SiO$_2$, 7 to 13% Al$_2$O$_3$, 7 to 20% CaO, 3 to 13% MgO, 3 to 13% ZnO, 0.5 to 3% K$_2$O or Na$_2$O, 0 to 11% PbO and 0 to 3% ZrO$_2$, wherein all percents are molar.

* * * * *

TABLE 2

| Run No. | Coefficient of Thermal Expansion ($\times 10^{-7}$/°C.) | Glass Transition Temperature (°C.) | Liquid Layer Temperature (°C.) | Knoop Hardness (kg/mm$^2$) | Strong Acid Solution Scorching Test | Mouth Nip Test |
|---|---|---|---|---|---|---|
| 1 | 46 | 698 | 1,050 | 644 | No abnormality | No formation |
| 2 | 49 | 703 | 1,040 | 636 | " | " |
| 3 | 55 | 670 | 1,100 | — | " | " |
| 4 | 52 | 665 | 1,030 | — | " | " |
| 5 | 44 | 735 | 1,230 | — | " | " |
| 6 | 42 | 740 | 1,200 | — | " | " |
| 7 | 55 | 742 | 1,250 | 660 | " | " |
| 8 | 41 | 755 | 1,250 | — | " | " |